(12) United States Patent
Macnamara et al.

(10) Patent No.: US 9,911,563 B2
(45) Date of Patent: Mar. 6, 2018

(54) MEMS SWITCH DEVICE AND METHOD OF FABRICATION

(71) Applicant: ANALOG DEVICES GLOBAL, Hamilton (BM)

(72) Inventors: John G Macnamara, Sixmilebridge (IE); Padraig L. Fitzgerald, Mallow (IE); Raymond C Goggin, Watergrasshill (IE); Bernard P Stenson, County Limerick (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 643 days.

(21) Appl. No.: 13/955,866

(22) Filed: Jul. 31, 2013

(65) Prior Publication Data
US 2015/0035387 A1 Feb. 5, 2015

(51) Int. Cl.
*H01H 59/00* (2006.01)
*B81C 1/00* (2006.01)
*B81B 7/00* (2006.01)
*H01H 1/00* (2006.01)

(52) U.S. Cl.
CPC ......... *H01H 59/0009* (2013.01); *B81B 7/007* (2013.01); *B81C 1/00341* (2013.01); *B81B 2201/014* (2013.01); *B81B 2207/092* (2013.01); *H01H 2001/0052* (2013.01); *H01L 2224/45144* (2013.01); *H01L 2224/48091* (2013.01); *H01L 2224/48137* (2013.01); *H01L 2224/48247* (2013.01); *H01L 2224/49109* (2013.01); *H01L 2924/181* (2013.01); *Y10T 307/937* (2015.04)

(58) Field of Classification Search
CPC .......................... B81B 7/007; Y10T 307/937
See application file for complete search history.

(56) References Cited

U.S. PATENT DOCUMENTS 5,638,946 A * 6/1997 Zavracky ............... G11C 23/00
200/181
6,046,659 A * 4/2000 Loo ....................... B81B 3/0072
200/181

(Continued)

FOREIGN PATENT DOCUMENTS

DE  10 2006 061386 B3  6/2008
JP  2004-006664  1/2004

(Continued)

OTHER PUBLICATIONS

Pacheco, "RF MEMS Resonator for CMOS back-end-of-line integration," 2004, IEEE, pp. 203-206.*

(Continued)

*Primary Examiner* — Thienvu Tran
*Assistant Examiner* — Pinping Sun
(74) *Attorney, Agent, or Firm* — Knobbe, Martens, Olson & Bear LLP (57) ABSTRACT

A MEMS switch device including: a substrate layer; an insulating layer formed over the substrate layer; and a MEMS switch module having a plurality of contacts formed on the surface of the insulating layer, wherein the insulating layer includes a number of conductive pathways formed within the insulating layer, the conductive pathways being configured to interconnect selected contacts of the MEMS switch module.

28 Claims, 5 Drawing Sheets

(56) References Cited

U.S. PATENT DOCUMENTS

| | | | | |
|---|---|---|---|---|
| 6,384,353 | B1* | 5/2002 | Huang | B81B 7/007 200/181 |
| 6,809,412 | B1* | 10/2004 | Tourino | B81B 7/007 257/678 |
| 7,042,308 | B2* | 5/2006 | Chou | H01H 59/0009 333/105 |
| 7,205,173 | B2* | 4/2007 | Brunson | B81C 1/00246 438/372 |
| 7,615,845 | B1* | 11/2009 | Blixhavn | B81B 3/0086 257/545 |
| 7,692,519 | B2* | 4/2010 | Premerlani | H01H 59/0009 333/105 |
| 7,956,709 | B2* | 6/2011 | Watanabe | H01C 10/50 200/181 |
| 8,194,382 | B2* | 6/2012 | Ellis | H01H 59/0009 361/211 |
| 8,569,091 | B2* | 10/2013 | Anderson | B81C 1/00333 438/50 |
| 8,633,049 | B2* | 1/2014 | Nasiri | B81C 1/00238 257/E21.499 |
| 2002/0153236 | A1 | 10/2002 | Song et al. | |
| 2003/0116417 | A1* | 6/2003 | DeReus | B81B 3/0024 200/181 |
| 2004/0008097 | A1* | 1/2004 | Ma | H01H 59/0009 333/262 |
| 2004/0188785 | A1* | 9/2004 | Cunningham | B81B 3/0024 257/415 |
| 2006/0263967 | A1 | 11/2006 | Falster et al. | |
| 2006/0290443 | A1* | 12/2006 | Chou | H01H 59/0009 333/105 |
| 2007/0000427 | A1 | 1/2007 | Umeno et al. | |
| 2010/0052103 | A1 | 3/2010 | Umeno et al. | |
| 2010/0068854 | A1* | 3/2010 | Schirmer | H01H 1/0036 438/125 |
| 2010/0155202 | A1* | 6/2010 | Ellis | H01H 59/0009 200/181 |
| 2010/0156577 | A1* | 6/2010 | Wang | H01H 59/0009 335/78 |
| 2011/0019330 | A1* | 1/2011 | Hunt | H01H 47/14 361/211 |
| 2011/0049649 | A1* | 3/2011 | Anderson | B81C 1/00333 257/415 |
| 2012/0080737 | A1* | 4/2012 | Zaitsu | H01L 27/11521 257/315 |
| 2012/0125747 | A1 | 5/2012 | Chu et al. | |
| 2013/0075888 | A1* | 3/2013 | Chang | B81C 1/0023 257/704 |
| 2014/0240944 | A1* | 8/2014 | Stenson | H01L 28/00 361/781 |
| 2015/0170911 | A1 | 6/2015 | Lambkin et al. | |

FOREIGN PATENT DOCUMENTS

| | | | | |
|---|---|---|---|---|
| WO | WO 03/041133 | A2 | 5/2003 | |
| WO | WO 2010/072431 | A1 | 7/2010 | |
| WO | WO 2010072431 | A1 * | 7/2010 | H01H 59/0009 |
| WO | WO 2013/033613 | A2 | 3/2013 | |
| WO | WO 2013033613 | A2 * | 3/2013 | H01G 5/18 |

OTHER PUBLICATIONS

Michaelsen, "Layout and CMos processing technology," spring 2012, university of oslo, pp. 1-76.*

Goggin, Ray et al., :"Fully Integrated, High Yielding, High Reliability DC Contact MEMS Switch Technology & Control IC in Standard Plastic Packages," 2011 IEEE Sensors, Limerick, Ireland, Oct. 28-31, 2011, in 4 pages.

Yasaitis, John et al., "A Modular Process for Integrating Thick Polysilicon MEMS Devices with Sub-Micron CMOS," Micromachining and Microfabrication Process Technology VIII, vol. 4979 (2003), pp. 145-154.

Extended European Search Report dated Feb. 5, 2015, issued in EP Application No. 14178181.5 filed Jul. 23, 2014, 9 pages.

Extended European Search Report dated May 19, 2015 for European Patent Application No. 14195923.9, 8 pages.

Gamble et al., "Low-loss CPW lines on surfaces stabilized high-resistivity silicon," IEEE Microwave and Guided Wave Letters, Oct. 1999, vol. 9, No. 10, pp. 395-397.

Lederer et al., "New substrate passivation method dedicated to HR SOI wafer fabrication with increased substrate resistivity," IEEE Electron Device Letters, Nov. 2005, vol. 26, No. 11, pp. 805-807.

Li et al., "Electro-thermally actuated RF MEMS switch for wireless communications," NANO/MICRO Engineered and Molecular Systems (NEMS), 2010 5th IEEE International Conference on, IEEE, Piscataway, NJ, USA, Jan. 20, 2010, pp. 497-500.

Neve, C. et al., "RF Harmonic Distortion of CPW Lines on HR-Si and Trap-Rich HR-SI Substrates," IEEE Transactions on Electron Devices, Apr. 2012, vol. 59, No. 4, pp. 924-932.

Sterner et al., "Static zero-power-consumption coplanar waveguide embedded DC-to-RF metal-contact MEMS switches in two-port and three-port configuration," IEEE Transactions on Electron Devices, IEEE Service Center, Pisacataway, NJ, US, vol. 57, No. 7, Jul. 1, 2010, pp. 1659-1669.

Taiwan Office Action dated Apr. 7, 2016 issued in Taiwan Patent Application No. 103125617, in 16 pages.

Taiwan Office Action dated Aug. 24, 2016 issued in Taiwan Patent Application No. 103125617, in 12 pages.

Taiwan Office Action dated Feb. 23, 2017 issued in Taiwan Patent Application No. 103125617, in 9 pages.

Examination Report dated Jul. 20, 2017 for European Patent Application No. 14178181.5, 6 pages.

* cited by examiner

MEMS SWITCH DEVICE AND METHOD OF FABRICATION

BACKGROUND TO THE INVENTION

Micro-electro-mechanical systems (MEMS) is a technology of very small devices. MEMS are typically made up of components in the range of 1-100 μm in size and MEMS devices generally range in size from 20 μm to 1 mm. An example of a MEMS device is a MEMS switch. Typically such MEMS switches are manufactured using a technique known as surface micromachining. In MEMS devices formed using surface micromachining the MEMS elements are formed on the surface of a substrate using conventional lithography and etching technology familiar from surface semiconductor processing. The interconnects and other circuit elements, such as resistors, for operating the MEMS switch are also formed on the surface of the substrate. However, forming the interconnects and desired resistors using conventional surface silicon processing techniques and materials may result in the interconnects being unreliable due to surface corrosion of the interconnects and leakage currents between adjacent surface interconnects.

SUMMARY

According to various embodiments there is provided a MEMS switch device including a substrate layer, an insulating layer formed over the substrate layer, and a MEMS switch module having a plurality of contacts formed upon the surface of the insulating layer, wherein the insulating layer includes a number of conductive pathways formed within the insulating layer, the conductive pathways being configured to interconnect selected contacts of the MEMS switch module.

At least one of the conductive pathways preferably includes a track of conductive material, such as aluminium, below the surface of the insulating layer and at least one conductive via, such as a tungsten via, extending from the track to the surface of the insulating layer. Furthermore, each conductive via may be electrically connected to one of the contacts of the MEMS switch module.

At least one of the conductive pathways may include a track of resistive material, such as polysilicon, the conductive pathway preferably being configured as a resistive circuit element. The MEMS switch module may include a switch beam, wherein the resistive circuit element is preferably formed within the insulating layer and is aligned with the switch beam.

The MEMS switch device may further comprise a control module in electric communication with the MEMS switch module.

The substrate layer can comprise a high resistivity material, for example silicon, quartz, sapphire, gallium arsenide or glass.

The MEMS switch device may further include a protective housing enclosing the MEMS switch module. The protective housing can comprise silicon bonded to the insulating layer.

In some embodiments, a method of fabricating a MEMS switch device is disclosed. The method includes forming an insulating layer over a substrate layer and forming a number of conductive pathways within the insulating layer and subsequently forming on the surface of the insulating layer a MEMS switch module including a plurality of contacts, whereby selected contacts are configured to be interconnected by the conductor pathways within the insulating layer.

The method may further include, after forming the MEMS switch module, forming a protective cap enclosing the MEMS switch module.

The method may further include providing a control module arranged to be in electrical communication with the MEMS switch module. The MEMS switch device may be encapsulated with a protective plastic material.

BRIEF DESCRIPTION OF THE DRAWINGS

Embodiments of the present invention are described below, by way of non-limiting examples only, with reference to the accompanying figures of which.

DETAILED DESCRIPTION OF THE PREFERRED EMBODIMENT

Figure 1:
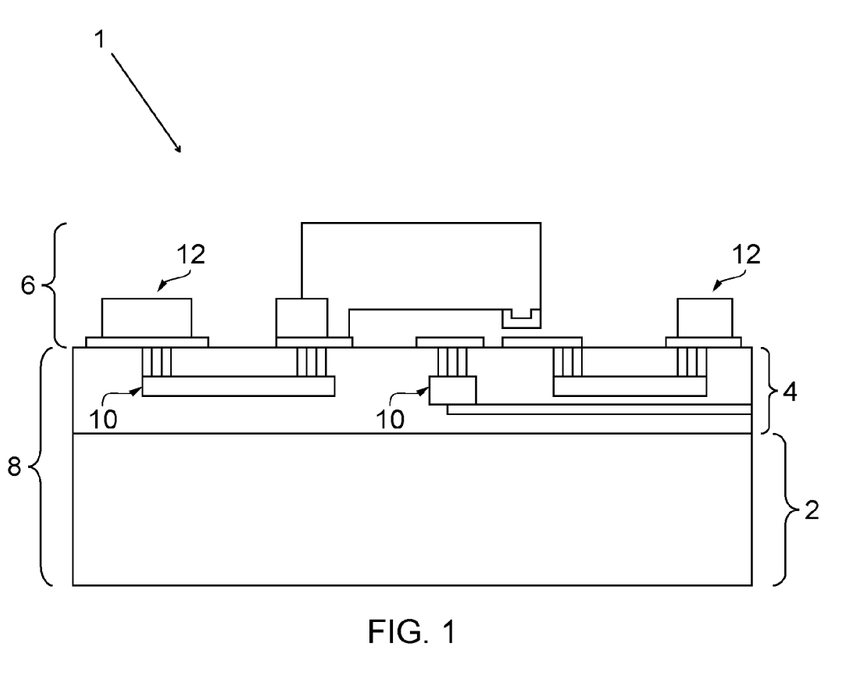
FIG. 1 is a schematic side cross section illustrating a MEMS switch device according to embodiments of the present invention.

FIG. 1 schematically illustrates a MEMS switch device 1 according to one embodiment. The MEMS switch device 1 includes a substrate layer 2, an insulating layer 4 formed over the substrate layer 2, and a MEMS switch module 6 formed on the surface of the insulating layer 4. The substrate layer 2 and the insulating layer 4 can be formed using equipment and materials typically employed for complementary metal-oxide-semiconductor (CMOS) backend processing techniques (e.g., oxide deposition, tungsten deposition, aluminum deposition, photolithography and etching, chemical mechanical planarization, etc.), although other suitable processing techniques may be used. The substrate layer 2 and insulating layer 4 are referred to together herein as a CMOS backend 8. In the particular embodiment illustrated in FIG. 1, the CMOS backend 8 has a number of conductive pathways 10 formed within the insulating layer 4. The conductive pathways 10 can interconnect selected contacts 12 of the MEMS switch module 6 formed on a surface of the insulating layer 4. It will be understood that, in practice, the insulating layer 4 is typically formed from multiple oxide depositions.

Figure 2:
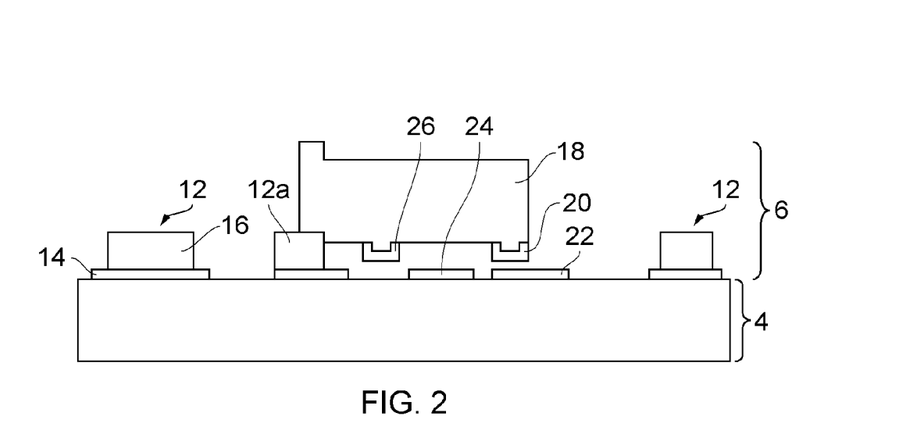
FIG. 2 is a schematic side cross section illustrating a MEMS switch module of the switch device shown in FIG. 1.

FIG. 2 schematically illustrates the MEMS switch module 6 formed on the surface of the insulating layer 4. In FIG. 2, the conductive pathways 10 illustrated in FIG. 1 are not illustrated for the purposes of clarity. As referred to above with reference to FIG. 1, the illustrated MEMS switch module 6 includes a number of electrical contacts 12 formed on the surface of the insulating layer 4. In the illustrated embodiment each contact 12 includes a first layer 14 of electrically conductive material, such as any one of the noble metals, e.g. ruthenium or platinum, formed on the surface of the insulating layer 4, and a second electrically conductive layer 16 can be formed over the top of the first layer 14. The second layer 16 can be more electrically conductive than the first layer 14. The second conductive layer 16 may be, for example, gold, which is highly conductive and highly resistant to corrosion. The first layer 14 can act to ensure a better electrical and physical contact with the insulating layer 4 than would be provided with a contact 12 formed solely of the second conductive material 16, such as gold. In the embodiment illustrated in FIG. 2, the MEMS switch module 6 also includes a MEMS switch beam 18 that is electrically and physically connected to a further contact 12a, which is referred to herein as an anchor contact. The MEMS switch beam 18 can be formed of gold in some embodiments. The anchor contact 12a serves a dual purpose of physically supporting one end of the switch beam 18 on the surface of the insulating layer 4 and also providing an electrical connection to the switch beam 18 via the contact 12a. In the particular embodiment illustrated in FIG. 2, the switch beam 18 is cantilevered from anchor contact 12a so as to be separated from the surface of the insulating layer 4. At the end of the switch beam 18 opposite to the anchor contact 12a, a contact tip 20 is formed on the underside of the beam 18, the contact tip 20 being coated in a hard conductive material, such as one of the noble metals. The contact tip 20 is located above a further contact pad 22, which may also be formed from a relatively hardwearing conductive material such as a noble metal. The provision of the hardwearing coatings 20, 22 on the contact tip 20 of the switch beam 18 and the corresponding contact pad 22 on the surface of the insulating layer 4 can prevent these surfaces from potentially softening and sticking together at high switching frequencies, which may occur if a softer conductive material, such as gold, were to be used. While not separately called out in FIGS. 1 and 4, the material choices for the MEMS switch module 6 of FIG. 2 are also applicable to the MEMS switch modules of FIGS. 1 and 4.

In operation, a voltage is applied to a gate electrode 24, which can also be formed from a noble metal, such as ruthenium. Applying the voltage to the gate electrode 24 creates an electrostatic force attracting the switch beam 18 towards the gate electrode 24. The electrostatic force causes the switch beam 18 to deform and the beam tip 20 to come into contact with contact pad 22, thus closing an electric circuit between the contact pad 22 and anchor contact 12a. In the particular embodiment illustrated in FIG. 2, a further projection or protrusion 26 is formed on the underside of the switch beam 18 between the anchor pad 12a and the gate electrode 24. The protrusion 26, also referred to as a "bumper," prevents the switch beam 18 from collapsing into contact with the gate electrode 24, which may occur through metal fatigue or if an excessive electrostatic force is generated.

The MEMS switch module 6 is fabricated on the insulating layer 4 by using surface processing techniques including deposition, masking and etching steps. In the illustrated embodiment, the switch module 6 does not include any conductive pathways formed on the surface (e.g., exterior surface) of the insulating layer 4 interconnecting any of the contacts 12, 12a, 22, 24.

Figure 3:
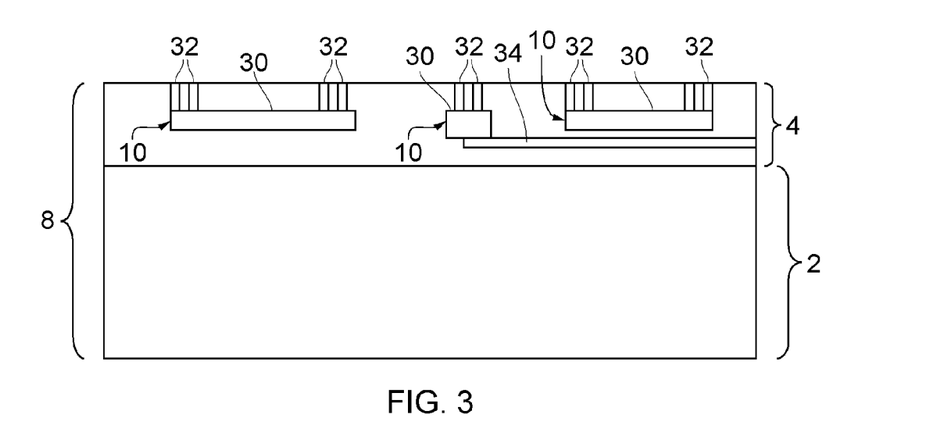
FIG. 3 is a schematic side cross section illustrating a substrate and insulating layer of the MEMS switch device shown in FIG. 1.

FIG. 3 schematically illustrates the CMOS backend 8, including the substrate layer 2 and the insulating layer 4. In some embodiments the insulating layer 4 is formed from silicon dioxide, but other insulating materials known to be used instead of silicon dioxide may be used as appropriate. Formed within the insulating layer 4 are a number of conductive pathways 10. Typically the conductive pathways include a linear trace 30 formed of a resistant material, such as aluminum, formed horizontally within the insulating layer 4. The conductive traces 30 can be buried within the insulating layer 4. A number of conductive vias 32 can extend from the traces 30 to the surface of the insulating layer 4. The conductive vias 32 may be formed from tungsten plugs, or other appropriate conductive material. The vias 32 may vary in size and number as appropriate. The vias 32 and traces 30 are formed within the insulating layer 4 using known bulk processing techniques, such as those typically used in the production of CMOS devices. The insulating substrate layer 2 is, typically, in preferred embodiments, formed from high resistivity silicon, but may be formed from other high resistivity substances, such as quartz, sapphire, gallium arsenide and glass etc. Other conductive pathways may be formed within the insulating layer 4, as required by the desired electrical circuitry for the MEMS switch module 6. An example of such a further conductive pathway is a higher resistance resistor 34, which in some embodiments is formed from high resistance polysilicon embedded within the insulating layer 4. Such a resistor when formed underneath the switch beam 18 of the switch module 6 can serve the purpose of decoupling any undesirable capacitance between the switch beam 18 and the insulating layer 4.

With reference back to FIG. 1, it can be seen that the conductive vias 32 form electrical interconnections between the contact pads of the MEMS switch module 6 and the conductor traces 30, thus forming the desired conductive pathways between the different elements of the MEMS switch module 6. The conductive pathways of the illustrated embodiment are thus completely buried within the insulating layer 4 and thus protected from corrosion and other degradation.

Figure 4:
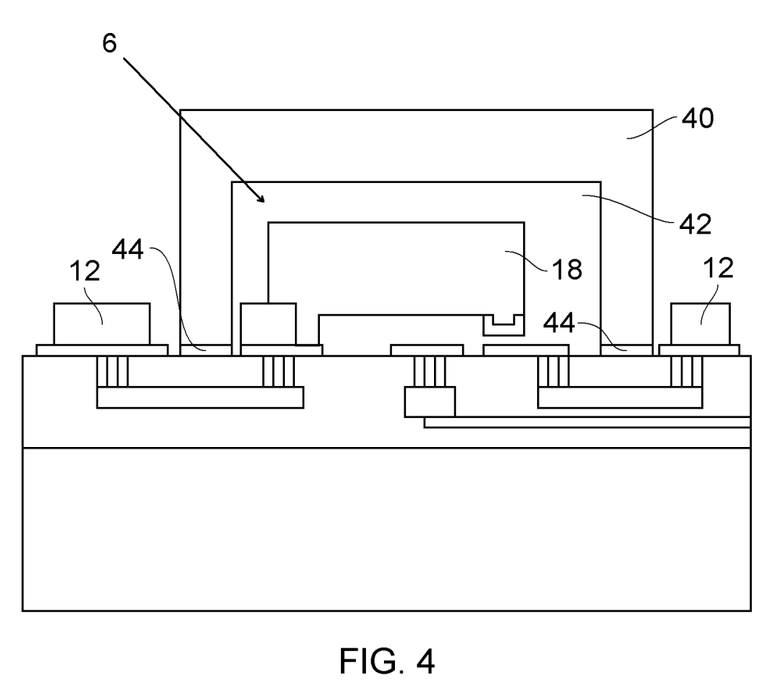
FIG. 4 is a schematic side cross section illustrating a further embodiment of the MEMS switch device with a protective cap formed over a portion of the MEMS switch module.

In further embodiments, further protection of the MEMS switch module is provided by the provision of a protective cap. Referring to FIG. 4, a protective silicon cap 40 is placed over the switch beam 18 of the switch module 6, leaving the relevant contact pads 12 outside the protective cap 40. The protective cap 40 can be formed from a single block of appropriate material, such as silicon, with an internal cavity 42 etched out. The cap 40 is bonded to the surface of the insulating layer 4 on which the MEMS switch module 6 is formed using appropriate bonding techniques, such as anodic bonding or using an appropriate adhesive, such as the illustrated glass 44. The protective cap 40 helps to prevent moisture and other contaminants from interfering with the switch module operation and helps prevent subsequent plastic molding steps from damaging the switch module during the plastic package assembly process. The protective cap 40 can also prevent mechanical damage of the MEMS switch module and can prevent particles getting underneath the switch beam 18. A further benefit of the protective cap 40 is to provide a controlled environment in which the actual MEMS switch operates. For example, the interior cavity 42 of the cap 40 may be filled with an inert gas.

Figure 5:
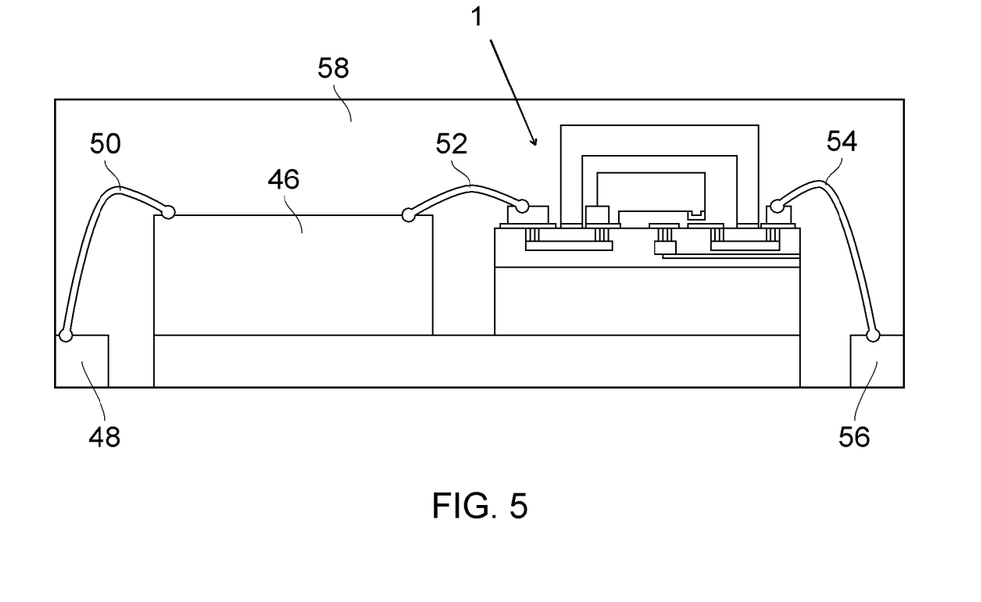
FIG. 5 is a schematic side cross section illustrating the MEMS switch device and protective cap shown in FIG. 4 packaged in combination with a control module.

FIG. 5 schematically illustrates the MEMS switch device and protective cap shown in FIG. 4 packaged in combination with a control module 46. The control module 46 is preferably an application specific integrated circuit (ASIC) and is provided to generate appropriate high voltage (for example, about 80V) switching signals to be applied to the MEMS switch device in response to received logic signals, for example, about 3V. The lower voltage control logic signals are applied to the control module 46 by means of an input connection 48 and a wire bond connection 50 to the control module. A further wire bond 52 can connect an output of the control module 46 and one of the contact pads of the MEMS switch device. The output signals from the MEMS switch device can be output via a further wire bond 54 to an output 56 of the package. In some embodiments the input connection 48, control module 46, MEMS switch device 1 and output 56 are encapsulated in a typical packaging plastic material 58 in accordance with known packaging techniques. Whilst illustrated with the control module 46 and MEMS switch device package 1 side-by-side, alternatively the MEMS switch device 1 may be stacked on top of the control module 46, and some or all of the wirebonds can be replaced with other forms of interconnection (e.g., flipchip, through silicon vias, etc.).

Figure 6:
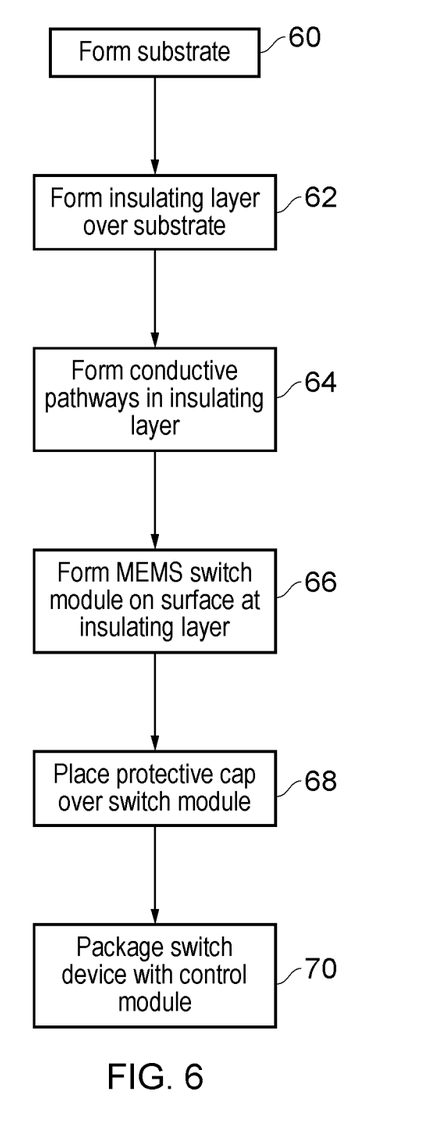
FIG. 6 is a flowchart illustrating a method for manufacturing a MEMS switch device, according to one embodiment.

FIG. 6 is a flowchart illustrating a method for manufacturing a MEMS switch device, according to one embodiment. In an initial step 60 of the illustrated embodiment, the substrate layer 2 of the CMOS backend is formed using conventional bulk processing/wafer processing techniques. The next step 62 is to form the insulating layer 4 over the substrate 2, with the subsequent step 64 being to form the conductive pathways in the insulating layer. The skilled artisan will appreciate that, in practice, portions of the insulating layer 4 are formed before and after forming the conductive pathways. The initial steps used to form the backend, including the conductive pathways, can all be completed using conventional bulk processing technology. Subsequent to this, the backend wafer is then processed in accordance with surface processing techniques to form, at step 66, the MEMS switch module on the surface of the insulating layer 4. If desired, the protective cap may subsequently be formed over the switch module (at step 68), with the MEMS switch device and control module, if desired, subsequently packaged in accordance with conventional packaging techniques (step 70). Although the method illustrated in FIG. 6 has been described in accordance with particular orders or sequences, it should be appreciated that other orders or sequences may be suitable.

The MEMS switch device and method of fabricating the MEMS switch device according to the embodiments disclosed herein buries the conductive pathways (interconnects) in a manufacturable manner, using backend CMOS-type processing. This avoids the problems experienced with MEMS switch devices fabricated solely with surface micromachine technology in which the interconnects were unburied and therefore were prone to corrosion and leakage currents between interconnects developing due to exposure.

Furthermore, as explained above, in some embodiments, the MEMS switch beam 18 can be formed of a highly conductive and corrosion-resistant metal, particularly gold. Using gold for the switch beam 18 and the second conductive layer 16 can greatly reduce the amount of losses as compared to switches manufactured using a semiconductor material (e.g., silicon). Without being limited by theory, it is believed that a gold switch is advantageous compared to using a semiconductor switch because, when the gold switch is closed, the switch acts as a substantially loss-less analog device such that the input signal is substantially the same as the output signal (e.g., the gold switch in the closed configuration may act as a gold wire). In some embodiments, the MEMS switches described herein are integrated with high frequency circuits, such as RF arrays. For example, gold switch beams may be used in RF applications at operating frequencies between about 11 GHz and about 100 GHz. For example in some embodiments, the disclosed switch beams may be used in RF applications at operating frequencies of at least about 77 GHz.

In other embodiments, MEMS switches as described herein are used to replace much larger mechanical relays in applications where a smaller profile is desired. For example, in medical applications in which the switch may be used inside the human body, highly reliable and loss-less MEMS switches disclosed herein may be made to be smaller than conventional mechanical relays.

Accordingly, in various embodiments, as explained herein, it can be advantageous to use a MEMS switch with conductive parts including gold, platinum, and/or ruthenium. However, the use of such metals in conjunction with conventional CMOS fabrication facilities may be undesirable. For example, if a conventional CMOS fabrication facility were used to fabricate both the CMOS backend 8 and a MEMS switch module 6 that uses a gold switch beam 18, gold used to form the switch beam 18 may contaminate the carefully calibrated CMOS facilities and any future CMOS processes used in the facility.

Accordingly, it can be advantageous to manufacture the CMOS backend 8 in a first fabrication facility. The CMOS backend 8 can then be transported to a separate fabrication facility for the manufacture of the MEMS switch module 6, for example, modules that include gold switch beams. The transfer can be conducted prior to dicing or after dicing wafers. The techniques taught herein enable both the use of buried interconnects and the use of exotic materials for the MEMS switch that may be incompatible with the facility (e.g., CMOS fabrication facility) used to create the buried interconnects.

What is claimed is:

1. A microelectromechanical systems (MEMS) switch device including:
   a substrate layer;
   an insulating layer deposited on the substrate layer; and
   a MEMS switch module including a switch beam and having a plurality of contacts formed on a surface of the insulating layer, wherein the plurality of contacts includes a gate electrode formed on the surface of the insulating layer in alignment with the switch beam and at least one electrical contact formed on the surface of the insulating layer, wherein application of a voltage to the gate electrode creates an electrostatic force that attracts the switch beam towards the gate electrode, and wherein the insulating layer includes a number of conductive pathways buried within the insulating layer, the number of conductive pathways comprising tracks of conductive material below the surface of the insulating layer, the tracks including metal(s) comprising only non-noble metal(s), the plurality of contacts on the surface of the insulating layer comprising only noble metal(s), the conductive pathways electrically connected to the gate electrode and the at least one electrical contact of the MEMS switch module.

2. A MEMS switch device according to claim 1, wherein at least one of the number of conductive pathways includes a first track of conductive material and a conductive via extending vertically from the first track toward the surface of the insulating layer.

3. A MEMS switch device according to claim 2, wherein the conductive via is electrically connected to one of the contacts of the MEMS switch module.

4. A MEMS switch device according to claim 2, wherein the first track of conductive material comprises aluminum.

5. A MEMS switch device according to claim 2, wherein the conductive via comprises tungsten.

6. A MEMS switch device according to claim 1, wherein at least one conductive pathway of the number of conductive pathways includes a track of resistive material.

7. A MEMS switch device according to claim 6, wherein the at least one conductive pathway is configured as a resistive circuit element.

8. A MEMS switch device according to claim 7, wherein the resistive circuit element is formed within the insulating layer and is aligned with the switch beam.

9. A MEMS switch device according to claim 6, wherein the resistive material comprises polysilicon.

10. A MEMS switch device according to claim 1, further comprising a control module in electric communication with the MEMS switch module.

11. A MEMS switch device according to claim 1, wherein the substrate layer comprises a high resistivity material.

12. A MEMS switch device according to claim 11, wherein the high resistivity material is one of silicon, quartz, sapphire, gallium arsenide and glass.

13. A MEMS switch device according to claim 1, wherein the MEMS switch device further includes a protective housing enclosing the MEMS switch module.

14. A MEMS switch device according to claim 13, wherein the protective housing comprises silicon bonded to the insulating layer.

15. A MEMS switch device according to claim 1, the MEMS switch beam comprising gold.

16. A MEMS switch device according to claim 1, further comprising:
a protective housing enclosing the MEMS switch module, the first contact disposed inside the protective housing; and
a bond pad disposed on the surface of the insulating layer outside the protective housing,
wherein a first conductive pathway of the number of conductive pathways extends downwardly from a first contact away from the surface, laterally underneath a wall of the protective housing, and upwardly towards the surface to the bond pad.

17. A MEMS switch device according to claim 1, wherein the plurality of contacts comprises a noble metal and the conductive pathways comprise a metal different from the noble metal.

18. A MEMS switch device according to claim 1, wherein the insulating layer comprises silicon oxide.

19. A method of fabricating a microelectromechanical systems (MEMS) switch device including:
forming an insulating layer over a substrate layer;
forming a number of conductive pathways buried within the insulating layer, the number of conductive pathways comprising tracks of conductive material below a surface of the insulating layer, the tracks including metal(s) comprising only non-noble metal(s); and
forming on the surface of the insulating layer a MEMS switch module, the MEMS switch module including a switch beam and a plurality of contacts, the plurality of contacts on the surface of the insulating layer comprising only noble metal(s), wherein the plurality of contacts includes a gate electrode formed on the surface of the insulating layer in alignment with the switch beam and at least one electrical contact formed on the surface of the insulating layer, wherein application of a voltage to the gate electrode creates an electrostatic force that attracts the switch beam towards the gate electrode, wherein the gate electrode and the at least one electrical contact electrically connects to the conductive pathways within the insulating layer.

20. The method of claim 19 further including:
after forming the MEMS switch module, forming a protective cap enclosing the MEMS switch module.

21. The method of claim 19, further including providing a control module arranged to be in electrical communication with the MEMS switch module.

22. The method of claim 21, further including encapsulating the MEMS switch device with a protective plastic material.

23. The method of claim 19, wherein the conductive pathways comprise a first metal and the plurality of contacts comprise a second metal, the second metal comprising a noble metal and being different from the first metal.

24. The method of claim 19, further comprising forming the number of conductive pathways in a first processing facility and forming the MEMS switch module in a second processing facility different from the first processing facility.

25. The method of claim 24, further comprising using backend semiconductor processing techniques in the first facility to form the insulating layer and to form the number of conductive pathways.

26. The method of claim 25, further comprising using surface processing techniques in the second facility to form on the surface of the insulating layer the MEMS switch module.

27. A microelectromechanical systems (MEMS) switch device including:
a substrate layer;
an insulating layer formed over the substrate layer, the insulating layer including a plurality of conductive pathways embedded in the insulating layer, and
a MEMS switch module including a switch beam cantilevered from an anchor, a plurality of contacts including a gate electrode and a contact pad on a surface of the insulating layer, a contact tip at a distal portion of the switch beam, and a protrusion extending from an underside of the switch beam, the protrusion disposed along the switch beam laterally between the contact tip and the anchor, the switch beam and at least a portion of the protrusion comprising noble metal(s), the plurality of conductive pathways electrically connected to the gate electrode and the contact pad, the plurality of contacts on the surface of the insulating layer comprising only noble metal(s),
wherein application of a voltage to the gate electrode creates an electrostatic force that attracts the contact tip of the switch beam towards the contact pad, and
wherein the protrusion is configured to prevent the switch beam from contacting the gate electrode.

28. A MEMS switch device according to claim 27, wherein the plurality of contacts comprises a noble metal and the plurality of conductive pathways comprises tracks of conductive material below a surface of the insulating layer, the tracks including metal(s) comprising only non-noble metal(s).

* * * * *